US008916851B2

(12) United States Patent
Eaton et al.

(10) Patent No.: US 8,916,851 B2
(45) Date of Patent: Dec. 23, 2014

(54) GRAPHENE-BASED DEVICE AND METHODS OF FORMING THE SAME

(76) Inventors: Kurt Eaton, West Linn, OR (US); Kimberly Eaton, West Linn, OR (US)

(*) Notice: Subject to any disclaimer, the term of this patent is extended or adjusted under 35 U.S.C. 154(b) by 38 days.

(21) Appl. No.: 13/355,473

(22) Filed: Jan. 20, 2012

(65) Prior Publication Data

US 2012/0187377 A1 Jul. 26, 2012

Related U.S. Application Data

(60) Provisional application No. 61/434,447, filed on Jan. 20, 2011.

(51) Int. Cl.
*H01L 29/06* (2006.01)
*H01L 29/16* (2006.01)
*H01L 29/861* (2006.01)
*H01L 51/00* (2006.01)

(52) U.S. Cl.
CPC .......... *H01L 29/861* (2013.01); *H01L 29/1606* (2013.01); *H01L 51/0045* (2013.01)
USPC ....... 257/29; 257/27; 257/E21.052; 257/E21.067; 257/E29.04; 438/478

(58) Field of Classification Search
USPC ......... 257/27, 29, E21.052, E21.067, E29.04; 438/478
See application file for complete search history.

(56) References Cited

U.S. PATENT DOCUMENTS

| 8,294,132 B2* | 10/2012 | Miao et al. ............. 257/3 |
| 2007/0001167 A1* | 1/2007 | Nomura ............. 257/40 |
| 2009/0236609 A1* | 9/2009 | de Heer et al. ............. 257/77 |
| 2012/0186639 A1* | 7/2012 | Zang et al. ............. 136/255 |

* cited by examiner

*Primary Examiner* — Andy Huynh

(57) ABSTRACT

A graphene-based device can be characterized as including a first electrode comprising graphene, a second electrode comprising graphene, and a potential barrier. The first electrode is physically separated from the second electrode by the potential barrier. The first electrode, second electrode and potential barrier are configured such that the graphene-based device can exhibit non-linear I-V characteristics under application of a voltage bias between the first electrode and the second electrode.

18 Claims, 1 Drawing Sheet

GRAPHENE-BASED DEVICE AND METHODS OF FORMING THE SAME

CROSS-REFERENCE TO RELATED APPLICATIONS

This application claims the benefit of U.S. Provisional Application No. 61/434,447, filed Jan. 20, 2011, the contents of which is incorporated herein in its entirety.

TECHNICAL FIELD

The embodiments disclosed herein relate generally to graphene-based devices. More particularly, certain embodiments disclosed herein relate to two-terminal graphene-based devices. Further, certain embodiments disclosed herein relate to graphene-based diode devices having a first electrode, second electrode and potential barrier that are configured to exhibit asymmetric, non-linear I-V characteristics under application of the voltage bias.

BACKGROUND

Graphene is essentially a 2-dimensional honeycomb lattice of carbon atoms, and can be accurately described as a zero band-gap semi-metal. Recently, a 100 GHz transistor has been fabricated from graphene (see Y. M. Lin, C. Dimitrakopoulos, K. A. Jenkins, D. B. Farmer, H. Y. Chiu, A. Grill and P. Avouris, Science 327, 662 (2010)) and methods enabling large-scale production of graphene are on the rise. Room temperature mobility within graphene is about 200,000 $cm^2V^{-1}s^{-1}$ at a carrier density of $10^{12}$ $cm^{-2}$. At room temperature, graphene has a resistivity of about $10^{-6}$ $\Omega \cdot cm$, which is less than the resistivity of silver (previously, the lowest resistivity substance known at room temperature). These properties have made graphene the subject of intense research in the semiconductor community for its potential applications in high-speed logic and memory devices. However, the semi-metallic nature of graphene presents numerous obstacles in realizing ultra-fast devices.

SUMMARY

According to some embodiments, a graphene-based device can be characterized as including a first electrode comprising graphene; a second electrode comprising graphene; and a potential barrier. The first electrode can be physically separated from the second electrode by the potential barrier and device can be configured to exhibit non-linear I-V characteristics under application of a voltage bias between the first electrode and the second electrode. In some embodiments, the I-V characteristics can be asymmetric (e.g., with respect to 0V). In some embodiments, the graphene-based device is a two-terminal device (i.e., a device without a gate).

DETAILED DESCRIPTION OF THE EMBODIMENTS

Figure 1:
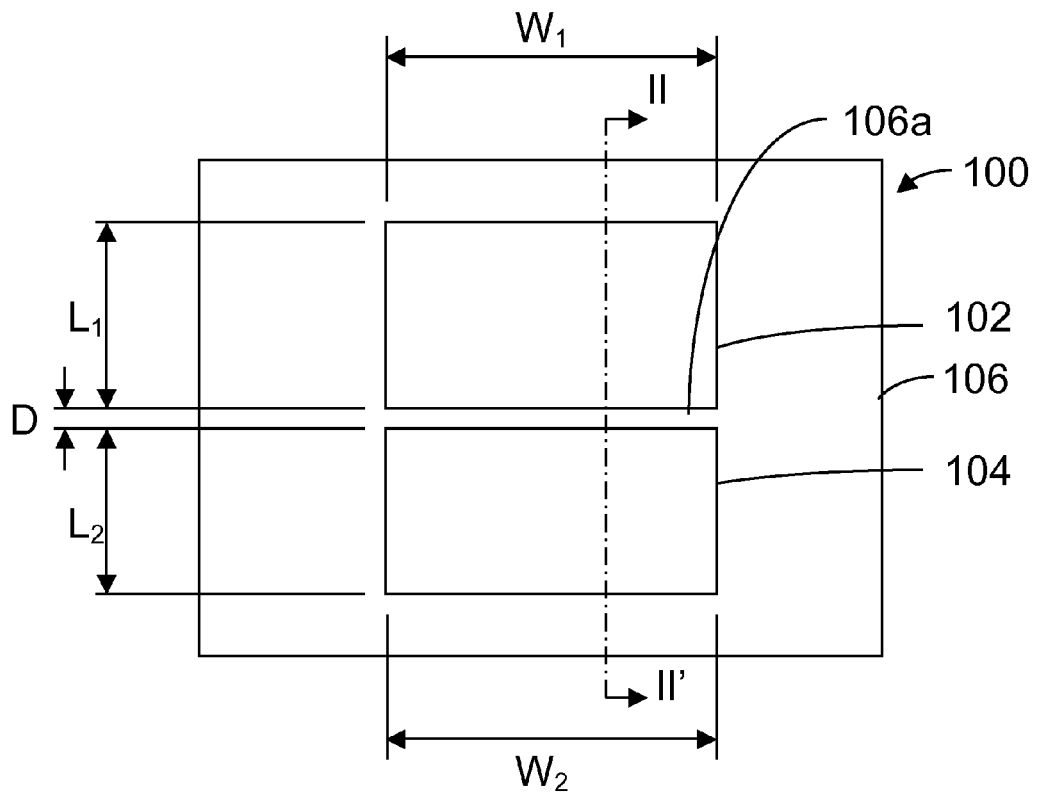
FIG. 1 illustrates a top plan, somewhat schematic, view of a graphene-based diode according to an embodiment of the present invention.

FIG. 1 illustrates a top plan, somewhat schematic, view of a graphene-based diode according to an embodiment of the present invention.

Referring to FIG. 1, a graphene-based device 100 can be generally characterized as including a first electrode 102 comprising graphene; a second electrode 104 comprising graphene; and a potential barrier 106a physically separating the first electrode 102 from the second electrode 104. Also shown in FIG. 1 is a high-resistance region 106 laterally surrounding the first electrode 102 and the second electrode 104. In the embodiment exemplarily illustrated in FIG. 1, a portion of the high-resistance region 106 located between the first electrode 102 and the second electrode 104 comprises the potential barrier 106a. According to principles of the invention, the first electrode 102, second electrode 104 and potential barrier 106 are configured such that the graphene-based device 100 exhibits non-linear I-V (current-voltage) characteristics under application of a voltage bias between the first electrode 102 and the second electrode 104. Thus, the graphene-based device 100 can be configured as a diode or a capacitor.

In one embodiment, the first electrode 102 and/or the second electrode 104 is provided as single-layer graphene. In another embodiment, at least one of the first electrode 102 and the second electrode 104 consists essentially of single-layer graphene. In other embodiments, however, one of the first electrode 102 or the second electrode 104 may be provided as bilayer graphene, few layer graphene, or multi-layer graphene.

In one embodiment, a work function of the first electrode 102 is different from a work function of the second electrode 104. The work function of pristine graphene is about 4.5 eV. Thus, to modulate the work function of one or both of electrodes 102 and 104, the graphene may be doped. In one embodiment, one or both of electrodes 102 and 104 may be doped with at least one atom selected from the group consisting of Ni, Co, Pd, Al, Ag, Cu, Au and Pt, or the like. Doping may be accomplished in any suitable manner. For example, doping may be accomplished by avoiding chemical functionalization techniques (e.g., by contacting or otherwise bonding metal structures such as metallic contacts, metallic leads, etc. (not shown) containing Ni, Co, Pd, Al, Ag, Cu, Au, Pt, or the like, to the first electrode 102 and/or the second electrode 104). In this manner, the relative work function of the first electrode 102 and the second electrode 104 can be shifted, resulting in asymmetric I-V characteristics of the graphene-based device 100 under application of a voltage bias (e.g., forward or reverse) between the first electrode 102 and the second electrode 104.

As illustrated, the first electrode 102 has a width $W_1$ and length $L_1$. Similarly, the second electrode 104 has a width $W_2$ and length $L_2$. In one embodiment, $W_1$ ranges from about 10 nm to about 50 nm. For example, $W_1$ can be about 10 nm, about 20 nm, about 30 nm, or about 50 nm. In another embodiment, $W_1$ can be greater than 50 nm. In one embodiment, $L_1$ ranges from about 20 nm to about 100 nm. For example, $L_1$ can be about 20 nm, about 50 nm, or about 100 nm. In another embodiment, $L_1$ can be greater than 100 nm. $W_2$ and $L_2$ can be the same as, greater than, or lesser than, $W_1$ and $L_1$, respectively.

In one embodiment, the first electrode 102 and the second electrode 104 are defined within the same (or integral) layer of graphene. In another embodiment, however, the first electrode 102 and the second electrode 104 are defined within different (or separate) graphene layers.

In one embodiment, the potential barrier 106a includes graphene. In such an embodiment, the graphene layer within which the potential barrier 106a is formed can be the same as the graphene layer within which the first electrode 102 and/or the second electrode 104 are defined. It will be appreciated that any graphene layer disclosed herein may be formed by any suitable method. For example, a graphene layer may be formed by a growth process from a solid carbon source as described by Z. Sun, Z. Yan, J. Yao, E. Beitler, Y. Zhu & J. M. Tour, Nature, Vol. 468, 549-552 (November 2010), the disclosure of which is incorporated herein by reference in its entirety.

In one embodiment, the potential barrier 106a includes doped graphene. In one embodiment, the dopant may include fluorine. Thus, the potential barrier 106a may include graphene that has been fluorinated to form an insulator. The graphene of the potential barrier 106a may be fluorinated in any manner. For example, the potential barrier 106a may be formed through a fluorination process described by J. T. Robinson, J. S. Burgess, C. E. Junkermeier, S. C. Badescu, T. L. Reinecke, F. Keith Perkins, M. K. Zalalutdniov, J. W. Baldwin, J. C. Culbertson, P. E. Sheehan, and E. S. Snow, Nano Lett., 10, 3001-3005 (2010), the disclosure of which is incorporated herein by reference in its entirety. In one embodiment, the first electrode 102, second electrode 104, high-resistance region 106 and potential barrier 106a may be formed simultaneously by providing a layer of graphene (e.g., a single layer of graphene) on a substrate, masking predetermined areas of the graphene layer corresponding to locations of the first electrode 102 and second electrode 104, and subjecting unmasked areas (corresponding to the high-resistance region 106 and the potential barrier 106a) to the aforementioned fluorination treatment. It will be appreciated that masking the predetermined areas may be accomplished by any suitable microlithographic or nanolithographic procedure (e.g., extreme ultraviolet lithography, nanoimprint lithography, scanning probe lithography, atomic force microscopic lithography, or the like, or any other suitable photolithographic process).

Accordingly, the high-resistance region 106 (and thus the potential barrier 106a) may be include $C_4F$ and/or CF, depending on the fluorination time and substrate used, while the first electrode 102 and second electrode 104 remain pristine graphene (or substantially pristine graphene). As a result, the potential barrier 106a may have a bandgap of at least about 2.93 eV (or at least 2.93 eV) or at least about 3.07 eV (or at least 3.07 eV). In one embodiment, however, the potential barrier 106a may have a different composition from the remainder of the high-resistance region 106 by differentially masking the high-resistance region 106 and location of the potential barrier 106a during the fluorination process. In another embodiment, the graphene of the potential barrier 106a may be n-doped or p-doped in any manner known in the art, while the remainder of the high-resistance region 106 can be made insulative as described above.

In one embodiment, the distance, D, by which the potential barrier separates the first electrode 102 from the second electrode 104, is at least about 5 nm (or at least 5 nm). In another embodiment, D is at least about 20 nm (or at least 20 nm). In yet another embodiment, D is at least about 30 nm (or at least 30 nm). In still another embodiment, D is at least about 50 nm (or at least 50 nm). Thus, D can be in a range between about 5 nm and about 50 nm (or between 5 nm and 50 nm) or greater than 50 nm.

Figure 2:
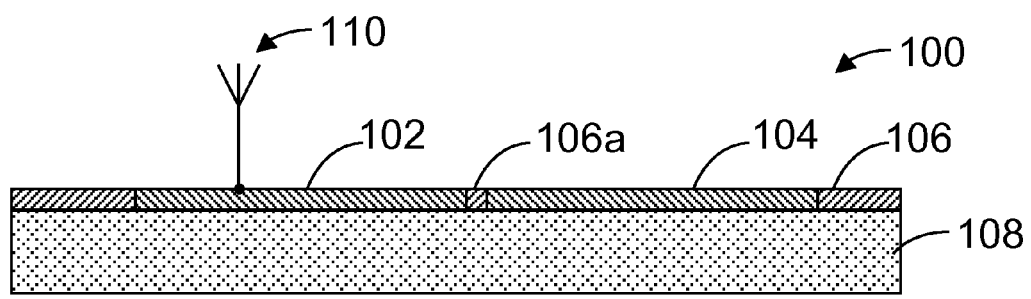
FIG. 2 illustrates a cross-sectional view of the graphene-based diode shown in FIG. 1, according to an embodiment of the present invention.

FIG. 2 illustrates a cross-sectional view of the graphene-based diode shown in FIG. 1, according to an embodiment of the present invention.

Referring to FIG. 2, the first electrode 102 and the second electrode 104 shown in FIG. 1 are supported by a substrate 108. As exemplarily shown, first electrode 102 (and the second electrode 104) directly contact a surface of the substrate 108. The substrate may include at least one material selected from the group consisting of Si, Cu, Ni, Ru, Rh, Ir, BN, SiC, or the like, or an oxide or a nitride thereof. In another embodiment, the substrate may include a polymer such as a polyethylene, a polypropylene, an acrylic, a fluoropolymer, a polystyrene, poly methylmethacrylate (PMMA), polyethylene terephthalate, a polyimide, a polyolefin, or the like or a combination thereof.

As also shown in FIG. 2, the first electrode 102 may be connected to a voltage source 110 (e.g., an antenna). It will be appreciated, however, that voltage source 110 may be any type of AC voltage source. Moreover, the second electrode 104 may alternatively, or additionally, be connected to a voltage source.

Constructed as exemplarily described above, an electron within the first electrode 102 can tunnel through the potential barrier into the second electrode 104 due to what is referred to as the Klein paradox. Upon tunneling, the graphene-based device exhibits non-linear I-V characteristics. Because the work function of the first electrode 102 can be made different from the work function of the second electrode 104, the I-V characteristics can be asymmetric (e.g., with respect to 0V). Thus upon tunneling, the AC voltage present at the first electrode 102 can be rectified.

Although discussion of the embodiments has been made with respect to the figures, it will be appreciated that the scope of the invention is not so limited. Indeed, features of the graphene-based device may be altered or combined as desired. For example, while it has been described that the graphene layer within which the first electrode 102 and the second electrode 104 are formed extends contiguously within the high-resistance region 106, the graphene layer within which the first electrode 102 and the second electrode 104 are formed need only extend to the boundaries of the electrodes, and between the electrodes. In another embodiment, while it has been described that the graphene layer within which the first electrode 102 and the second electrode 104 are formed extends contiguously within the potential barrier, the graphene layer within which the first electrode 102 and the second electrode 104 are formed need only extend to the boundaries of the electrodes, and not between the electrodes. Moreover, the potential barrier need not include any graphene layer at all. In such an embodiment, the potential barrier may be provided as an actual gap or "air gap" (i.e., absence of graphene) between the first electrode 102 and the second electrode 104. Such a gap between the first electrode 102 and the second electrode 104 may be formed by first forming a catalyst (e.g., Cu) pattern on a substrate, opening up a void within the catalyst pattern (e.g., via electromigration within the catalyst), and then forming a graphene layer, as discussed above. The voltage and current applied during catalyst electromigration can be controlled by any suitable means to open a void having a predetermined width such that, after the graphene layer is formed, the first electrode 102 is physically separated from the second electrode by a distance of at least about 0.5 nm (or at least 0.5 nm). Further, it will be recognized that the shape and dimensions of the first electrode 102, second electrode 104, and potential barrier may be configured in any manner as dictated by the application for the graphene-based device, input voltage, etc.

It should be appreciated that reference throughout this specification to "one embodiment," "an embodiment," "another embodiment," etc., means that a particular feature, structure or characteristic described in connection with the embodiment is included in at least one embodiment. Therefore, it should be emphasized and appreciated that two or more references to "an embodiment," "one embodiment," "another embodiment," etc., in various portions of this specification are not necessarily all referring to the same embodiment. Furthermore, the particular features, structures or characteristics may be combined as suitable in one or more embodiments.

It will be appreciated that several of the above-disclosed and other features and functions, or alternatives thereof, may be desirably combined into many other different systems or applications. It will also be appreciated that various presently unforeseen or unanticipated alternatives, modifications, variations, or improvements therein may be subsequently made by those skilled in the art which are also intended to be encompassed by the following claims.

What is claimed is:

1. A graphene-based device, comprising:
a first electrode comprising graphene,
a second electrode comprising graphene, wherein a work function of the first electrode is different from a work function of the second electrode; and
a potential barrier, wherein the first electrode is physically separated from the second electrode by the potential barrier.

2. The graphene-based device of claim 1, wherein at least one selected from the group consisting of the first electrode and the second electrode are doped with at least one atom selected from the group consisting of Ni, Co, Pd, Al, Ag, Cu, Au and Pt.

3. The graphene-based device of claim 2, wherein the at least one atom is comprised within a metal structure selected from the group consisting of a contact and a lead.

4. The graphene-based device of claim 1, further comprising a layer of graphene, wherein the potential barrier and at least one selected from the group consisting of the first electrode and the second electrode are defined within the layer of graphene.

5. The graphene-based device of claim 4, wherein the potential barrier comprises doped graphene.

6. The graphene-based device of claim 1, wherein the potential barrier comprises an insulator.

7. The graphene-based device of claim 1, wherein the potential barrier comprises single-layer graphene.

8. The graphene-based device of claim 1, wherein the potential barrier comprises a material having a band gap of at least about 2.93 eV.

9. The graphene-based device of claim 1, wherein the potential barrier is an air-gap between the first electrode and the second electrode.

10. The graphene-based device of claim 1, wherein the first electrode is physically separated from the second electrode by the potential barrier at a distance of at least about 0.5 nm.

11. The graphene-based device of claim 1, wherein the first electrode and the second electrode directly contact a surface of a substrate.

12. The graphene-based device of claim 11, wherein the substrate comprises at least one material selected from the group consisting of Si, Cu, Ni, Ru, Ir, BN, and SiC, or an oxide or a nitride thereof.

13. The graphene-based device of claim 11, wherein the substrate comprises at least one polymer selected from the group consisting of a polyethylene, a polypropylene, an acrylic, a fluoropolymer, polystyrene, poly methylmethacrylate (PMMA), polyethylene terephthalate, a polyimide and a polyolefin.

14. The graphene-based device of claim 1, wherein at least one selected from the group consisting of the first electrode and the second electrode is electrically connected to a voltage source.

15. The graphene-based device of claim 14, wherein the voltage source is an antenna.

16. A graphene-based device, comprising:
a layer of graphene;
a first electrode defined within the layer of graphene;
a second electrode defined within the same layer of graphene in which the first electrode is defined; and
a potential barrier, wherein the first a electrode is physically separated from the second electrode by the potential barrier,
wherein the graphene-based device is a two-terminal device.

17. The graphene-based device of claim 1, wherein first electrode, second electrode and potential barrier are configured such that the graphene-based device exhibits asymmetric, non-linear I-V characteristics under application of the voltage bias between the first electrode and the second electrode.

18. A method of forming a graphene-based device, comprising:
forming a first electrode comprising graphene;
forming a second electrode comprising graphene, wherein a work function of the first electrode is different from a work function of the second electrode; and
forming a potential barrier, wherein the first electrode is physically separated from the second electrode by the potential barrier.

* * * * *